US012604508B2

(12) United States Patent
Yoon

(10) Patent No.: US 12,604,508 B2
(45) Date of Patent: Apr. 14, 2026

(54) SEMICONDUCTOR DEVICE HAVING SIDE SPACER PATTERNS

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 385 days.

(21) Appl. No.: 18/321,785

(22) Filed: May 23, 2023

(65) Prior Publication Data

US 2024/0145577 A1    May 2, 2024

(30) Foreign Application Priority Data

Nov. 1, 2022    (KR) ........................ 10-2022-0143414

(51) Int. Cl.
| | |
|---|---|
| *H01L 29/66* | (2006.01) |
| *H01L 29/06* | (2006.01) |
| *H01L 29/08* | (2006.01) |
| *H01L 29/423* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |

(Continued)

(52) U.S. Cl.
CPC ......... *H10D 64/017* (2025.01); *H10D 30/014* (2025.01); *H10D 30/43* (2025.01); *H10D 30/6735* (2025.01); *H10D 30/6757* (2025.01); *H10D 62/121* (2025.01); *H10D 62/151* (2025.01); *H10D 64/021* (2025.01)

(58) Field of Classification Search
CPC .... H10D 30/014; H10D 30/024; H10D 30/43; H10D 30/62; H10D 30/6212; H10D 30/6213; H10D 30/6219; H10D 30/6713; H10D 30/6735; H10D 30/6757; H10D 30/797; H10D 62/021; H10D 62/118; H10D 62/119; H10D 62/121; H10D 62/149; H10D 62/151; H10D 64/015; H10D 64/017; H10D 64/018; H10D 64/021; H10D 84/013; H10D 84/0158; H10D 84/017; H10D 84/0193; H10D 84/834; H10D 84/853

See application file for complete search history.

(56) References Cited

U.S. PATENT DOCUMENTS

| | | | |
|---|---|---|---|
| 2021/0151608 A1 | 5/2021 | Lee et al. | |
| 2023/0051602 A1* | 2/2023 | Park ..................... | H10D 62/121 |
| 2023/0139255 A1* | 5/2023 | Agrawal .............. | H10D 64/018 |
| | | | 257/347 |

* cited by examiner

*Primary Examiner* — David C Spalla
(74) *Attorney, Agent, or Firm* — IP & T GROUP LLP

(57) ABSTRACT

A semiconductor device includes source/drain regions formed over a substrate, and channel patterns and gate structures formed between the source/drain regions in a horizontal direction. The channel patterns are arranged to be spaced apart from each other over a surface of the substrate in a vertical direction. The gate structures are disposed between the channel patterns in the vertical direction. The gate structures include the following: side spacer patterns formed adjacent to the source/drain regions in the first horizontal direction, interfacial insulating layers formed over upper and lower surfaces of the channel patterns, gate insulating layers over surfaces of the side spacer patterns and surfaces of the interfacial insulating layers, and gate electrodes over the gate insulating layers. The side spacer patterns include germanium (Ge).

19 Claims, 29 Drawing Sheets

(51) Int. Cl.
  H10D 62/10 (2025.01)
  H10D 62/13 (2025.01)
  H10D 64/01 (2025.01)

ACT

10

Z

X

I                    I'

SEMICONDUCTOR DEVICE HAVING SIDE SPACER PATTERNS

CROSS-REFERENCE TO RELATED APPLICATIONS

The present application claims priority under 35 U.S.C. § 119 to Korean Patent Application No. 10-2022-0143414, filed on Nov. 1, 2022, which is incorporated herein by reference in its entirety.

BACKGROUND

1. Field

Embodiments of the present disclosure relate to a semiconductor device having side spacer patterns and a method of manufacturing the semiconductor device.

2. Description of the Related Art

A gate-all-around (GAA) device having multi-channels has been proposed to improve the driving ability of a transistor.

SUMMARY

An embodiment of the present disclosure provides a semiconductor device having a side spacer pattern including germanium (Ge).

An embodiment of the present disclosure provides a method of manufacturing a semiconductor device having a side spacer pattern including germanium (Ge).

A semiconductor device in accordance with an embodiment of the present disclosure includes source/drain regions formed over a substrate, and channel patterns and gate structures formed between the source/drain regions in a horizontal direction. The channel patterns are arranged to be spaced apart from each other over a surface of the substrate in a vertical direction. The gate structures are disposed between the channel patterns in the vertical direction. The gate structures include side spacer patterns formed adjacent to the source/drain regions in the first horizontal direction; interfacial insulating layers formed over upper and lower surfaces of the channel patterns; gate insulating layers over surfaces of the side spacer patterns and surfaces of the interfacial insulating layers; and gate electrodes over the gate insulating layers. The side spacer patterns include germanium (Ge).

A semiconductor device in accordance with an embodiment of the present disclosure includes source/drain regions formed over a substrate; and channel patterns and gate structures formed between the source/drain regions in a horizontal direction. The channel patterns are arranged to be spaced apart from each other over a surface of the substrate in a vertical direction. The gate structures are disposed between the channel patterns in the vertical direction. The gate structures include: gate electrodes; gate insulating layers surrounding the gate electrodes; interfacial insulating layers surrounding the gate insulating layers; and first side spacer patterns and second side spacer patterns between the gate insulating layers and the source/drain regions. The channel patterns include silicon (Si). The first side spacer patterns include germanium (Ge). The second side spacer patterns include germanium oxide (GeO).

A method of manufacturing a semiconductor device in accordance with an embodiment of the present disclosure includes the following operations: alternately forming sacrificial patterns and channel patterns over a substrate in a vertical direction; forming first side spacer patterns over side end portions of the sacrificial patterns; forming source/drain regions on outer side surfaces of the first side spacer patterns and the channel patterns by performing an epitaxial process; forming gate spaces between the channel patterns by removing the sacrificial patterns; forming interfacial insulating layers over upper and lower surfaces of the channel patterns exposed in the gate spaces and forming second side spacer patterns on inner side surfaces of the first side spacer patterns by performing an oxidation process; forming gate insulating layers over the interfacial insulating layers and inner side surfaces of the second side spacer patterns; and forming a gate electrode over the gate insulating layers to fill the gate spaces. The first side spacer patterns include germanium (Ge).

A method of manufacturing a semiconductor device in accordance with another embodiment of the present disclosure includes the following operations: alternately forming sacrificial patterns and channel patterns in a vertical direction over a substrate; forming first side spacer patterns over side end portions of the sacrificial patterns; forming source/drain regions over side surfaces of the first side spacer patterns and the channel patterns over the substrate by performing an epitaxial growth process; forming gate spaces between the channel patterns by removing the sacrificial patterns; performing an oxidation process to form interfacial insulating layers over upper and lower surfaces of the channel patterns exposed in the gate spaces and second side spacer patterns over surfaces of the first side spacer patterns; forming gate insulating layers over the interfacial insulating layers and side surfaces of the second side spacer patterns; and forming gate electrodes over the gate insulating layers to fill the gate spaces. The channel patterns include silicon (Si). The first side spacer patterns include germanium (Ge). The second side spacer patterns include germanium oxide (GeO).

BRIEF DESCRIPTION OF THE DRAWINGS

FIGS. 4A and 4B to FIGS. 13A and 13B are views illustrating a method of manufacturing a semiconductor device according to various embodiments of the present disclosure.

DETAILED DESCRIPTION

Figure 1:
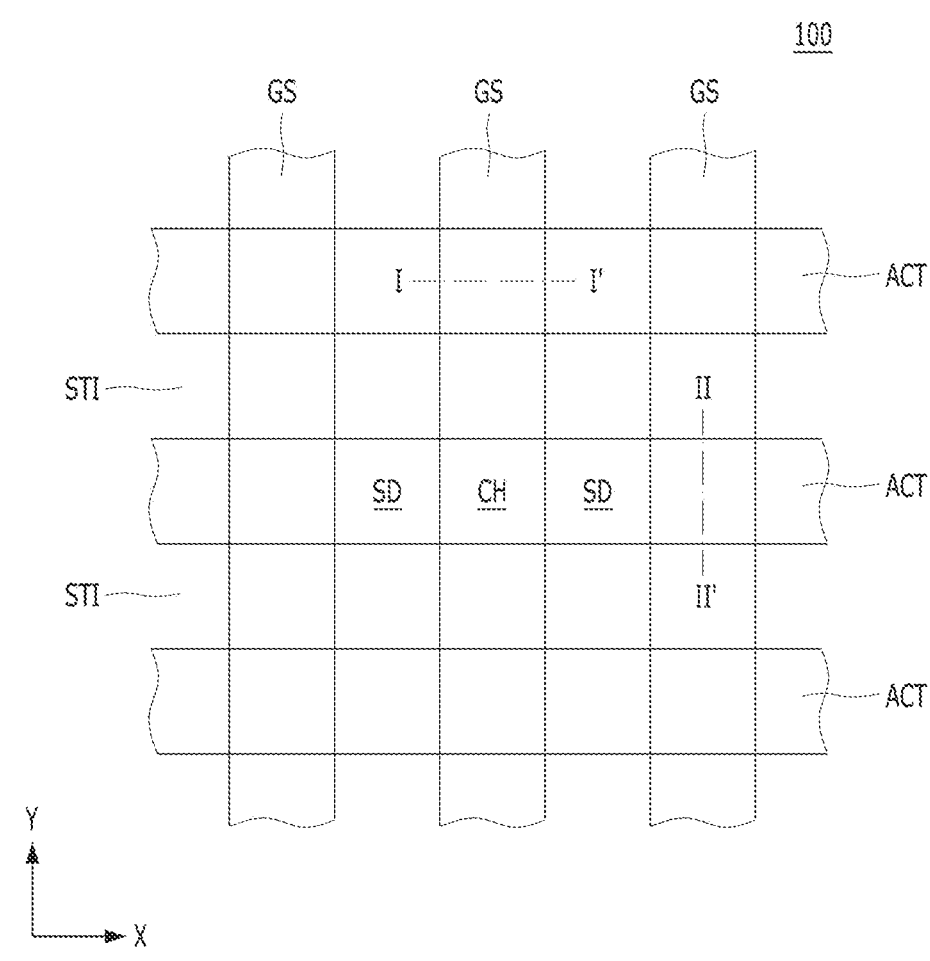
FIG. 1 is a layout of a semiconductor device according to an embodiment of the present disclosure.

Various embodiments of the present invention will be described below in more detail with reference to the accompanying drawings. The subject matter disclosed herein may, however, be embodied in different forms and should not be construed as limited to the embodiments set forth herein. Rather, these embodiments are provided for illustrations and as examples to those skilled in the art. Throughout this disclosure, like reference numerals refer to like parts throughout the various figures and embodiments of the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

Other expressions that describe the relationship between elements, such as "between,", "directly between,", "adjacent to," or "directly adjacent to," should be construed in the same way.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a layout of a semiconductor device 100 according to an embodiment of the present disclosure. Referring to FIG. 1, a semiconductor device 100 according to an embodiment may include an active region ACT extending in a first horizontal direction X and a gate structures GS extending in a second horizontal direction Y. The first horizontal direction X and the second horizontal direction Y may be perpendicular to each other. Accordingly, the active region ACT and the gate structure GS may cross in perpendicular to each other. The active region ACT may be defined by an isolation region STI. The active region ACT may include a channel region CH vertically overlapping the gate structure GS and source/drain regions SD not vertically overlapping the gate structure GS. The first and second source regions SD may be disposed at both sides of the channel region CH. In an embodiment, a plurality of active regions ACT may extend in parallel with one another. In an embodiment, a plurality of gate structures GS may extend in parallel with one another.

Figure 2A:
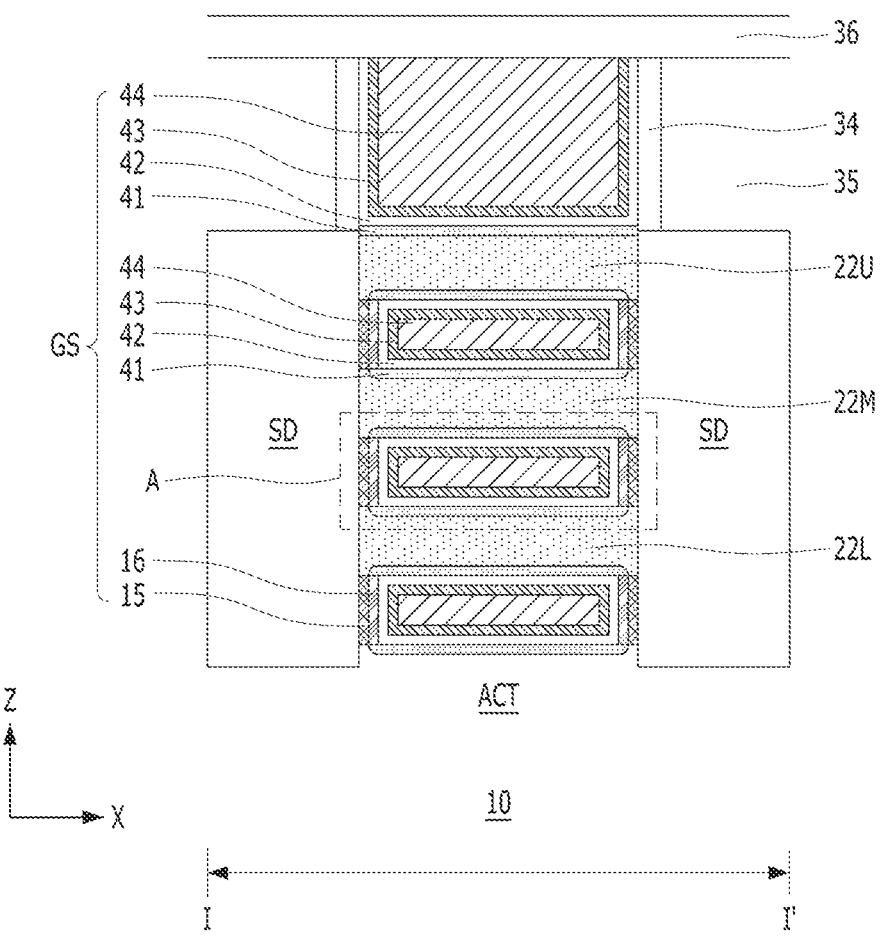
FIG. 2A is a longitudinal cross-sectional view of a semiconductor device in a first horizontal direction X taken along a line I-I' of FIG. 1.
Figure 2B:
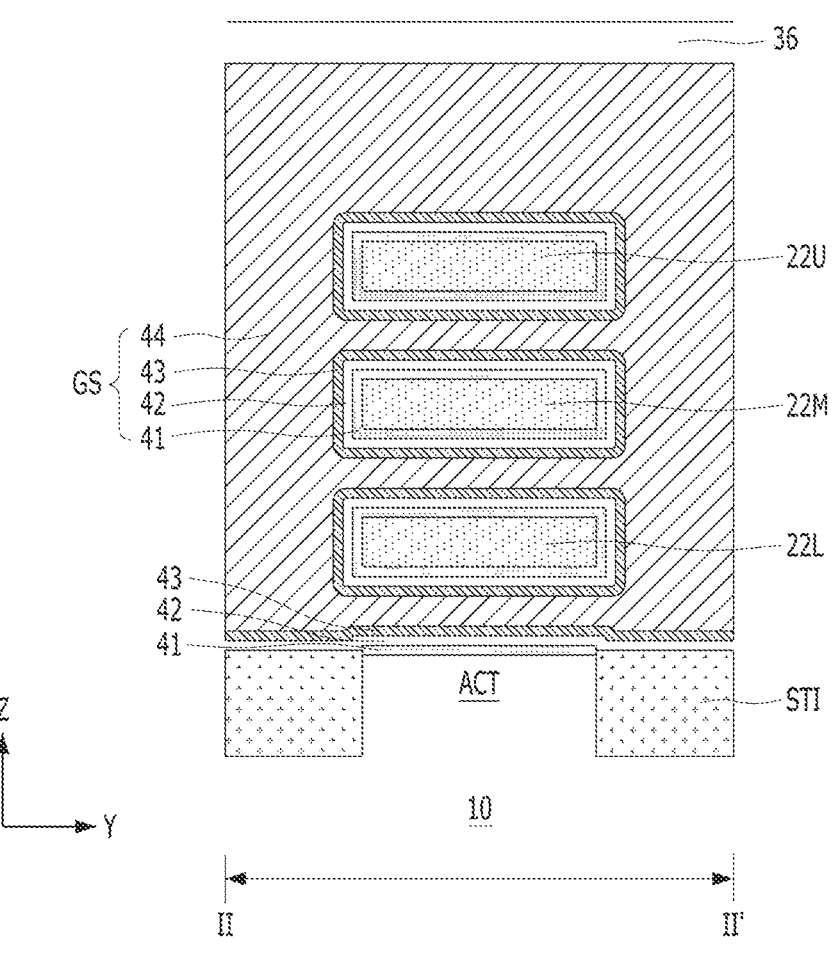
FIG. 2B is a longitudinal cross-sectional view of the semiconductor device in a second horizontal direction Y taken along a line II-II' of FIG. 1.
Figure 2C:
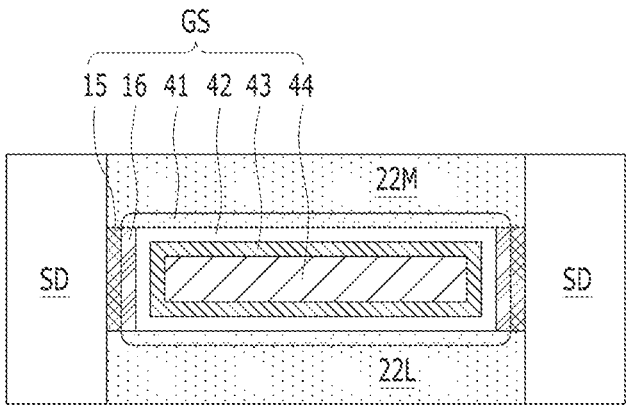
FIG. 2C is an enlarged view of an area A of FIG. 2A.

FIG. 2A is a longitudinal cross-sectional view of a semiconductor device 100A in a first horizontal direction X taken along a line I-I' of FIG. 1, FIG. 2B is a longitudinal cross-sectional view of the semiconductor device 100A in a second horizontal direction Y taken along a line II-II' of FIG. 1, and FIG. 2C is an enlarged view of an area A of FIG. 2A.

Referring to FIGS. 2A to 2C, a semiconductor device 100A according to an embodiment of the present disclosure may include a plurality of channel patterns 22L, 22M, and 22U, gate structures GS, and source/drain regions SD disposed over an active region ACT of a substrate 10. The channel patterns 22L, 22M, and 22U and the gate structures GS may be disposed between the source/drain regions SD in a horizontal direction.

The substrate 10 may include a single crystalline silicon wafer. In another embodiment, the substrate 10 may include at least one of the following: an epitaxially grown silicon layer, a silicon germanium (SiGe) layer, a silicon-on-insulator (SOI), and a compound semiconductor layer. The isolation region STI may include an insulating material such as silicon oxide or silicon nitride filled in a trench formed in the substrate 10. The isolation region STI may define the active region ACT. The active region ACT may upwardly protrude in the vertical direction Z. For example, the active region ACT may be a protruding part of the substrate 10.

The channel patterns 22L, 22M, and 22U may have a multi-bridge structure electrically connecting the source/drain regions SD in the first horizontal direction X. The channel patterns 22L, 22M, and 22U may be spaced apart from each other in the vertical direction Z. The channel patterns 22L, 22M, and 22U may include nano sheets or nano wires. The channel patterns 22L, 22M, and 22U may include single crystalline silicon. In the drawing, three-layered channel patterns 22L, 22M, and 22U are shown, however four or more channel patterns 22L, 22M, and 22U may be stacked.

The gate structures GS may be formed and inserted between the active region ACT of the substrate 10 and the lower channel pattern 22U, between the lower channel pattern 22L and the middle channel pattern 22M, between the middle channel pattern 22M and the upper channel patterned 22U, and over the upper channel pattern 22U in the vertical direction Z. The gate structures GS may include outer side spacer patterns 15, inner side spacer patterns 16, interfacial insulating layers 41, gate insulating layers 42, gate barrier layers 43, and gate electrodes 44.

The outer side spacer patterns 15 may be formed between outer sidewalls of the inner side spacer patterns 16 and inner sidewalls of the source/drain regions SD in a longitudinal cross-sectional view in the first horizontal direction X. That is, the outer side spacer patterns 15 may be disposed adjacent to the source/drain regions SD in the first horizontal direction X. In an embodiment, outer surfaces of the outer side spacer patterns 15 may be in contact with the source/drain regions SD. Upper end portions (upper surfaces) and lower end portions (lower surfaces) of the outer side spacer patterns 15 may be in contact with the channel patterns 22L, 22M, and 22U. In an embodiment, the outer side spacer patterns 15 may include pure germanium (Ge) (or single crystalline germanium (Ge) layer). Accordingly, the outer side spacer patterns 15 may have semiconductor characteristics. In an embodiment, the outer side spacer patterns 15 may include silicon-poor silicon germanium (SiGe) (or germanium-rich silicon germanium (SiGe)). The silicon-poor silicon germanium (SiGe) may have a silicon composition ratio (or silicon concentration) lower than a silicon composition ratio (or a silicon concentration) of silicon germanium (SiGe) in accordance with the law of definite proportions. Accordingly, the germanium-rich silicon germanium (SiGe) may have a germanium composition ratio (or a germanium concentration) higher than a germanium composition ratio (or a germanium concentration) of silicon germanium (SiGe) in accordance with the law of definite proportions. Accordingly, the outer side spacer patterns 15 can provide lattice stress to the adjacent source/drain regions SD due to a difference in lattice spacing between silicon (Si) and germanium (Ge). In addition, the outer side spacer patterns 15 can provide lattice stress to side end portions of the channel patterns 22L, 22M, and 22U. Accordingly, carrier mobility of the channel patterns 22L, 22M, and 22U can be improved. In the longitudinal cross-sectional view in the first horizontal direction X, the outer side spacer patterns 15 may be formed between the channel patterns 22L, 22M, and 22U in the vertical direction Z.

The inner side spacer patterns 16 may be formed between outer sidewalls of the gate insulating layers 42 and inner sidewalls of the outer side spacer patterns 15 in the longitudinal cross-sectional view in the first horizontal direction X. In an embodiment, the inner side spacer patterns 16 may include germanium oxide (GeO). Accordingly, the inner side spacer patterns 16 may have insulator characteristics. In an embodiment, the inner side spacer patterns 16 may include Si-poor silicon germanium oxide (SiGeO) or Ge-rich silicon germanium oxide (SiGeO). The silicon-poor silicon germanium oxide (SiGeO) may have a silicon composition ratio (or a silicon concentration) lower than a silicon composition ratio (or a silicon concentration) of silicon germanium oxide (SiGeO) in accordance with the law of definite proportions. Accordingly, the germanium-rich silicon germanium oxide (SiGeO) may have a germanium composition ratio (or a germanium concentration) higher than a germanium composition ratio (or a germanium concentration) of silicon germanium oxide (SiGeO) in accordance with the law of definite proportions.

The interfacial insulating layers 41 may be formed over surfaces of the channel patterns 22L, 22M, and 22U. For example, as shown in FIG. 2A, in the longitudinal cross-sectional view in the first horizontal direction X, the interfacial insulating layers 41 may be formed to surround upper and lower surfaces of the channel patterns 22L, 22M, and 22U, and as shown in FIG. 2B, in the longitudinal cross-sectional view in the second horizontal direction Y, the interfacial insulating layers 41 may surround the upper surfaces, the lower surfaces, and both side surfaces of the channel patterns 22L, 22M, and 22U. In the longitudinal cross-sectional view in the first horizontal direction X, side end portions of the interfacial insulating layers 41 may be in contact with upper and lower end portions of the inner side spacer pattern 16. The interfacial insulating layers 41 may include oxidized silicon or silicon oxide. For example, the interfacial insulating layers 41 may be formed by oxidizing surfaces of the channel patterns 22L, 22M, and 22U. The interfacial insulating layers 41 may be a single layer to be physically and materially continued.

The gate insulating layers 42 may be formed over the upper and lower surfaces of the interfacial insulating layers 41 and the inner surface of the inner side spacer patterns 16 in the longitudinal cross-sectional view in the first horizontal direction X, and the gate insulating layers 42 may be formed to surround the upper, lower, and side surfaces of the interfacial insulating layers 41 in the longitudinal cross-sectional view in the second horizontal direction Y. For example, in the longitudinal cross-sectional view in the first horizontal direction X, the gate insulating layers 42 may be surrounded by the interfacial insulating layers 41 and the inner side spacer patterns 16. Over the upper channel pattern 22U, the gate insulating layers 42 may be formed over the interfacial insulating layers 41 between the gate spacers 34. The gate insulating layers 42 may also be conformally formed over the inner walls of the gate spacers 34. The gate insulating layers 42 may be in contact with the interfacial insulating layers 41 in the vertical direction Z, and the side end portions of the gate insulating layers 42 may be in contact with the inner side surfaces of the inner side spacer patterns 16 in the first horizontal direction X. Over the upper channel pattern 22U, the gate insulating layers 42 may have a U-shaped cross section. The gate insulating layers 42 may include a high-k insulating material such as hafnium oxide (HfO). The gate insulating layers 42 may be a single layer to be physically and materially continued.

The gate barrier layers 43 may be surrounded by the gate insulating layers 42 in the longitudinal cross-sectional view in the first horizontal direction X, and the gate barrier layers 43 may surround the gate insulating layers 42 in the longitudinal cross-sectional view in the second horizontal direction Y. For example, the upper surface, the lower surface, and the side surfaces of the gate barrier layers 43 may be surrounded by the gate insulating layers 42 in the longitudinal cross-sectional view in the first horizontal direction X, and the gate barrier layer 43 may surround the upper surface, the lower surface, and the side surfaces of the gate insulating layers 42 in the longitudinal cross-sectional view in the second horizontal direction Y. Over the upper channel pattern 22U, the gate barrier layers 43 may have a U-shaped longitudinal cross-section conformally formed over the upper surface and inner walls of the gate insulating layers 42. Over the upper channel pattern 22U, the gate insulating layers 42 may surround a lower surface and side surfaces of the gate barrier layers 43. The gate barrier layers 43 may include a conductive barrier metal such as titanium nitride (TiN). The gate barrier layers 43 may be a single layer to be physically and materially continued.

The gate electrodes 44 may be surrounded by the gate barrier layers 43 in the longitudinal cross-sectional view in the first horizontal direction X, and the gate electrodes 44 may surround the gate barrier layers 43 in the longitudinal cross-sectional view in the second horizontal direction Y. For example, the upper surface, the lower surface, and the side surfaces of the gate electrodes 44 may be surrounded by the gate barrier layers 43 in the longitudinal cross-sectional view in the first horizontal direction X, and the gate electrodes 44 may surround the upper surface, the lower surface, and the side surfaces of the gate barrier layers 43 in the longitudinal cross-sectional view in the second horizontal direction Y. Over the upper channel pattern 22U, the gate barrier layers 43 may have a U-shaped cross section to surround the lower surface and side surfaces of the gate electrodes 44. In an embodiment, the gate electrodes 44 may include multiple metal layers, multiple metal compound layers, and a combination of metal alloy layers. For example, the gate electrodes 44 may include multiple conductive layers.

The source/drain regions SD may be formed over the substrate 10 to be connected to the side surfaces of the channel patterns 22L, 22M, and 22U. The source/drain regions SD may include silicon (Si) doped with phosphorus (P). In an embodiment, the source/drain regions SD may include silicon germanium (SiGe) doped with boron (B).

The semiconductor device 100A may further include an interlayer insulating layer 35 surrounding the side surfaces of the gate spacers 34 surrounding the side surfaces of the gate structures GS over the upper channel pattern 22U, and a capping insulating layer 36 over the gate structures GS and the interlayer insulating layer 35. The interlayer insulating layer 35 may include a material having an etch selectivity with respect to the gate spacers 34. For example, the interlayer insulating layer 35 may include at least one of the following: silicon oxide ($SiO_2$), silicon carbon oxide (SiCO), silicon hydrogen oxide (SiHO), silicon carbon hydrogen oxide (SiCHO), or silicon oxide ($SiO_2$) containing various impurities. The capping insulating layer 36 may include a material having an etch selectivity with respect to the interlayer insulating layer 35. For example, the capping insulating layer 36 may include at least one of silicon nitride (SiN), silicon oxynitride (SiON), silicon boron nitride (SiBN), or silicon nitride (SiN) containing various impurities.

The outer side spacer patterns 15 and the inner side spacer patterns 16 may include germanium (Ge). Accordingly, the outer side spacer patterns 15 and the inner side spacer patterns 16 may provide lattice stress to the source/drain regions SD including silicon (Si). Carrier mobility of the source/drain regions SD provided the lattice stress may be improved. In addition, the outer side spacer patterns 15 and the inner side spacer patterns 16 including germanium (Ge) may provide lattice stress to the channel patterns 22L, 22M, and 22U. Accordingly, carrier mobility of the channel patterns 22L, 22M, and 22U may be improved. In addition, since the outer side spacer patterns 15 and the inner side spacer patterns 16 can increase the distance between the gate structures GS and the source/drain regions SD, parasitic capacitance between the gate structures GS and the source/drain regions SD can be reduced.

Figure 3A:
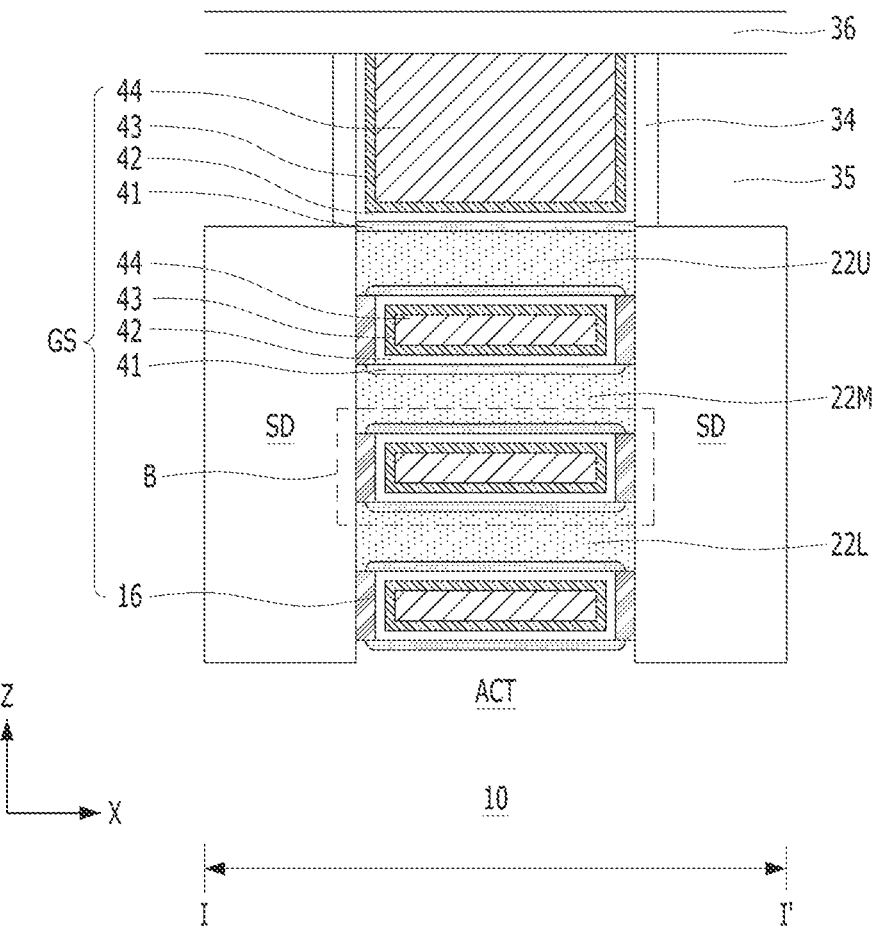
FIG. 3A is a longitudinal cross-sectional view of a semiconductor device in a first horizontal direction X taken along the line I-I' of FIG. 1.
Figure 3B:
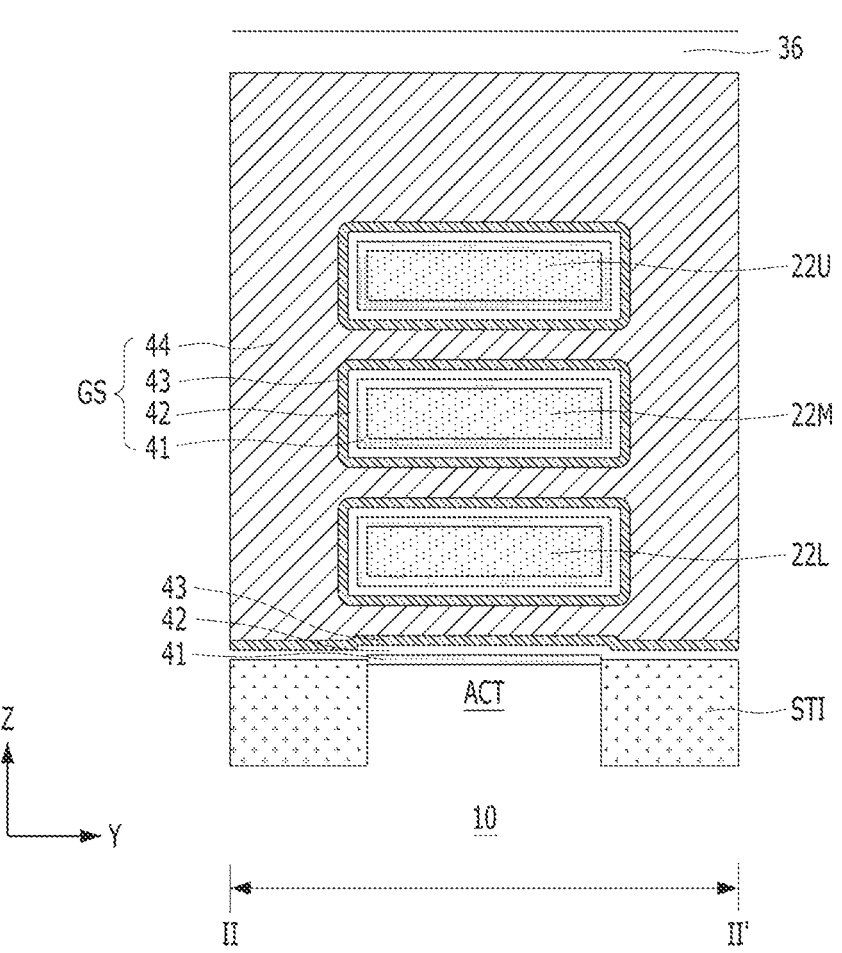
FIG. 3B is a longitudinal cross-sectional view of the semiconductor device in a second horizontal direction Y taken along the line II-II' of FIG. 1.
Figure 3C:
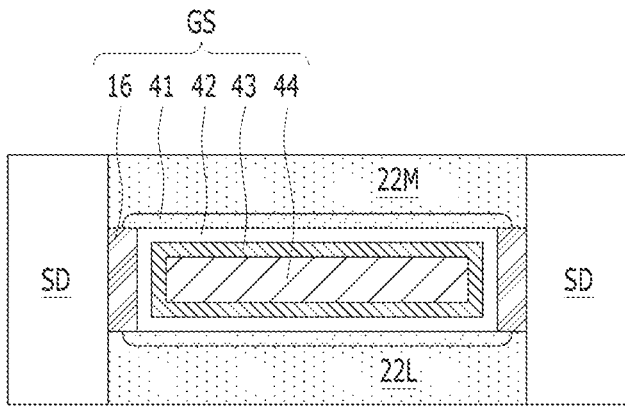
FIG. 3C is an enlarged view of an area B of FIG. 3A.

FIG. 3A is a longitudinal cross-sectional view of a semiconductor device 100B in the first horizontal direction X taken along the line I-I' of FIG. 1, FIG. 3B is a longitudinal cross-sectional view of the semiconductor device 100B in the second horizontal direction Y taken along the line II-II' of FIG. 1, and FIG. 3C is an enlarged view of an area B of FIG. 3A. Referring to FIGS. 3A to 3C, a semiconductor device 100B according to an embodiment of the present disclosure may include a plurality of channel patterns 22L, 22M, and 22U to be spaced apart from each other in a vertical direction Z and gate structures GS, and source/drain regions SD disposed over an active region ACT of a substrate 10. The plurality of channel patterns 22L, 22M, and 22U may include a lower channel pattern 22L, a middle channel pattern 22M, and an upper channel pattern 22U. The semiconductor device 100B may further include an interlayer insulating layer 35 surrounding gate spacers 34 surrounding side surfaces of the gate structures GS over the upper channel pattern 22U, and a capping insulating layer 36 over the gate structures GS and the interlayer insulating layer 35. The gate structures GS may include inner side spacer patterns 16, interfacial insulating layers 41, gate insulating layers 42, gate barrier layers 43, and gate electrodes 44. Compared to the semiconductor device 100A described with reference to FIGS. 2A to 2C, the outer side spacer patterns 15 may be omitted. For example, the outer side spacer patterns 15 may be fully reformed into the inner side spacer patterns 16. Accordingly, the inner side spacer patterns 16 of the semiconductor device 100B described with reference to FIGS. 3A to 3C may be thicker than the inner side spacer patterns 16 of the semiconductor device 100A described with reference to FIGS. 2A to 2C. Since the outer side spacer patterns 15 are omitted, the inner side spacer patterns 16 may be in contact with the source/drain regions SD. Other elements not described may be understood in the description referring to FIGS. 2A to 2C. Since the inner side spacer patterns 16 having insulating characteristics are formed thicker, parasitic capacitance between the gate structures GS and the source/drain regions SD may be further reduced.

FIGS. 4A and 4B to FIGS. 13A and 13B are views illustrating methods of manufacturing semiconductor devices according to various embodiments of the present disclosure. FIGS. 4A to 13A are longitudinal cross-sectional views taken along the line I-I' of FIG. 1, and FIGS. 4B to 13B are longitudinal cross-sectional views taken along the line II-II' of FIG. 1.

Figure 4A:
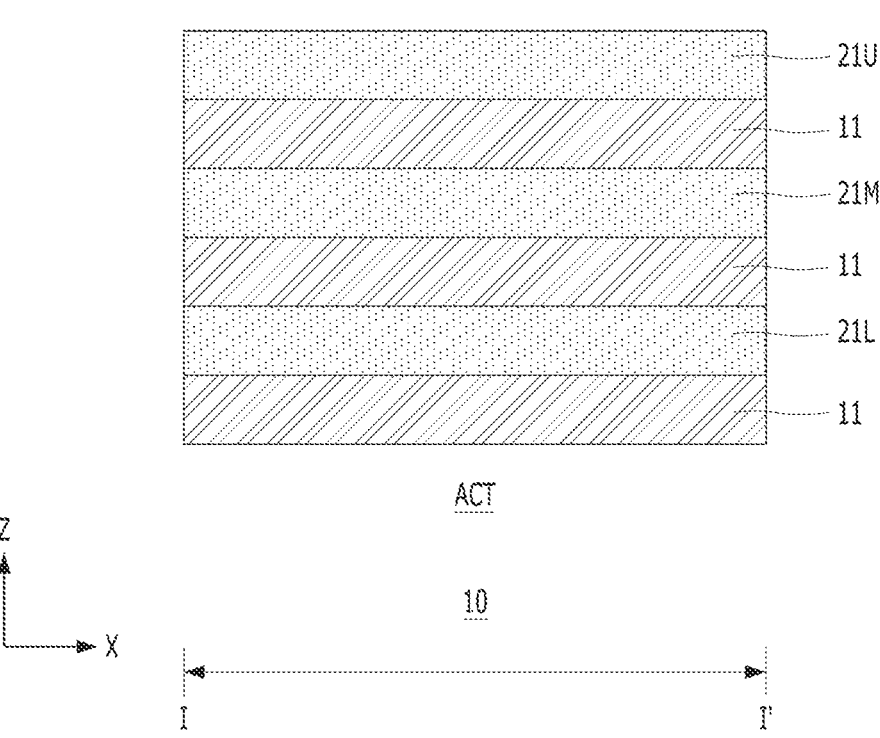
Figure 4B:
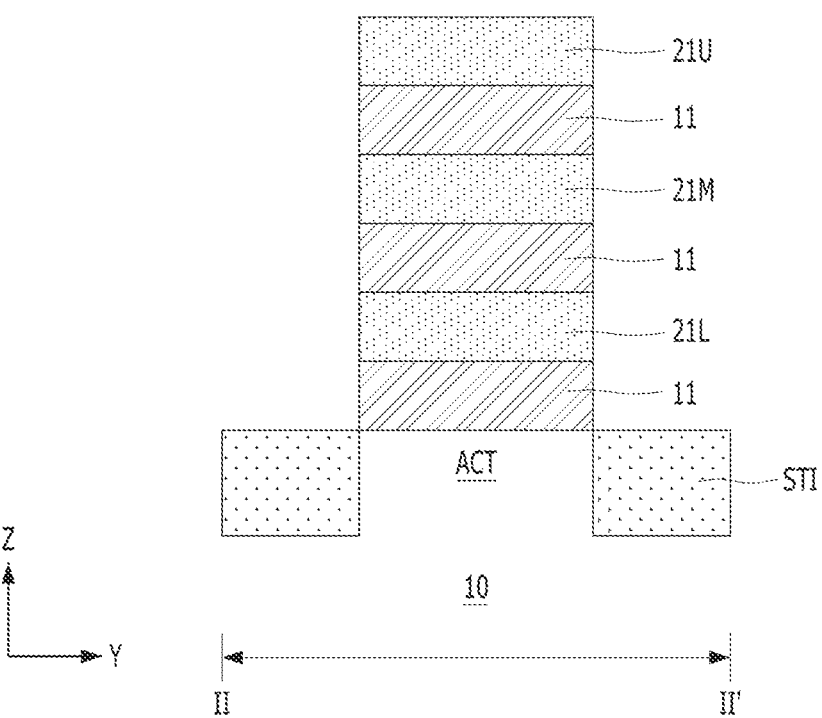

Referring to FIGS. 4A and 4B, a method of manufacturing a semiconductor device according to an embodiment of the present disclosure may include preparing a substrate 10, forming an isolation region STI defining an active region ACT over the substrate 10, and forming sacrificial layers 11 and channel layers 21L, 21M, and 21U over the substrate 10. The active region ACT may protrude from a surface of the substrate 10 in a vertical direction Z. Forming the isolation region STI may include forming a trench in the substrate 10 and filling the trench with an insulating material such as silicon oxide or silicon nitride. For example, the isolation region STI may be formed by performing a shallow trench isolation (STI) forming process. The sacrificial layers 11 and the channel layers 21L, 21M, and 21U may be alternately stacked in the vertical direction Z over the active region ACT. The channel layers 21L, 21M, and 21U may include a lower channel layer 21L, a middle channel layer 21M, and an upper channel layer 21U. The sacrificial layers 11 may include silicon germanium (SiGe) layers. The channel layers 21L, 21M, and 21U may include silicon (Si) layers. Forming the sacrificial layers 11 and the channel layers 21L, 21M, and 21U may include performing deposition processes or epitaxial growth processes. In the drawings, three layers of sacrificial layers 11 and three layers of channel layers 21L, 21M, and 21U are illustrated, but more sacrificial layers 11 and channel layers 21L, 21M, and 21U may be further formed. In an embodiment, the sacrificial layer 11 may be also formed between the substrate 10 and the lower channel layer 21L.

Figure 5A:
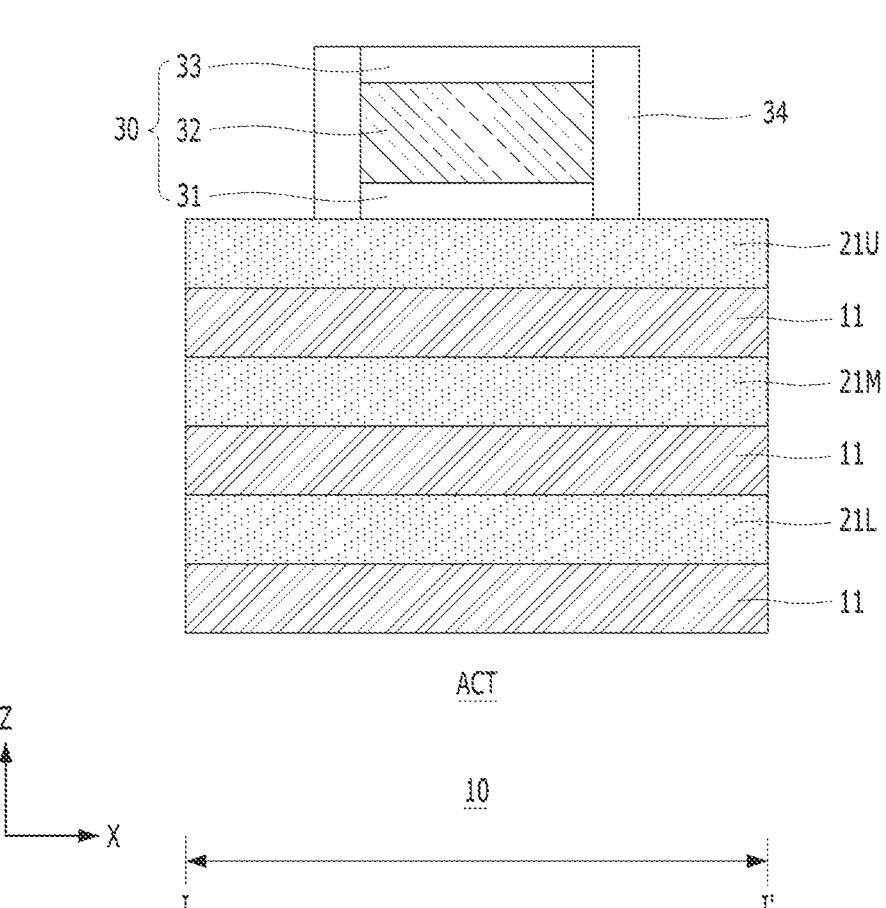
Figure 5B:
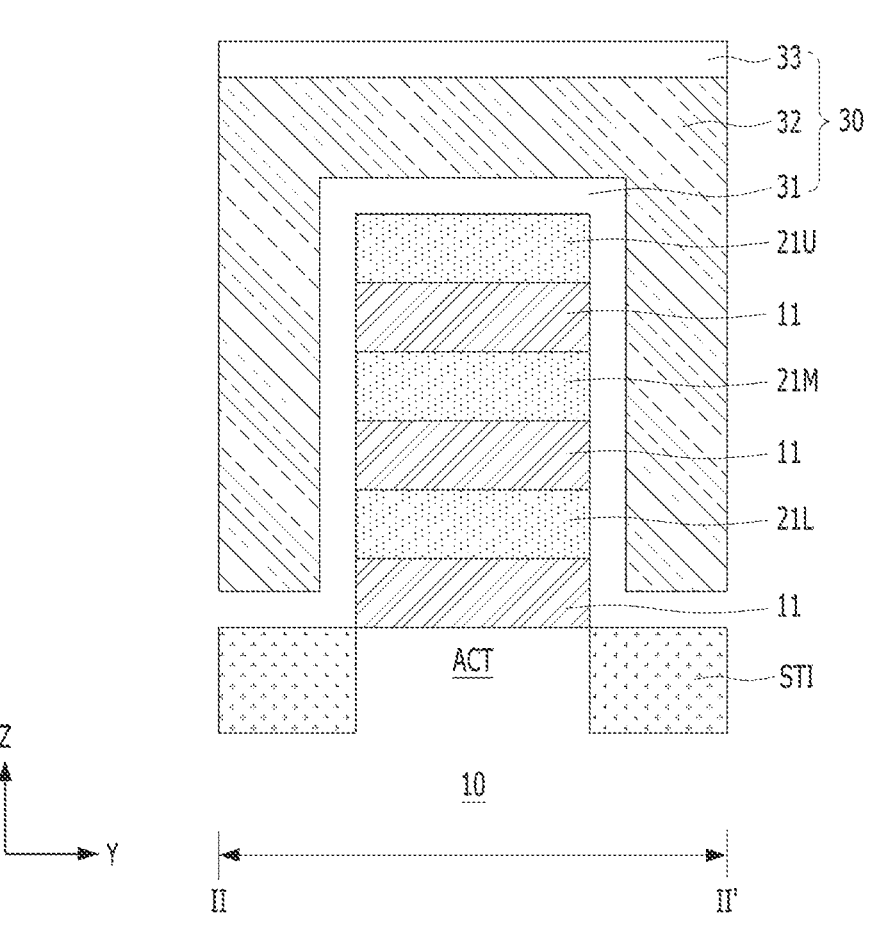

Referring to FIGS. 5A and 5B, the method may further include forming a dummy gate structure 30 and gate spacers 34 over the alternately stacked structure of the sacrificial layers 11 and channel layers 21L, 21M, and 21U. The dummy gate structure 30 may include a dummy gate insulating layer 31 over the upper channel layer 21U between the gate spacers 34, a dummy gate electrode 32 over the dummy gate insulating layer 31, and a dummy gate capping layer 33 over the dummy gate electrode 32. The gate spacers 34 may be formed on both sidewalls of the dummy gate structure 30. The dummy gate insulating layer 31 may include a material having an etch selectivity with respect to silicon (Si), silicon germanium (SiGe), and silicon oxide ($SiO_2$). For example, the dummy gate insulating layer 31 may include a silicon nitride (SiN) based insulating material. The dummy gate electrode 32 may include a material having an etch selectivity with respect to the dummy gate insulating layer 31. For example, the dummy gate electrode 32 may include poly-Si or silicon oxide ($SiO_2$). The dummy gate capping layer 33 may include a material having an etch selectivity with respect to the dummy gate electrode 32 and the channel layers 21L, 21M, and 21U. For example, the dummy gate capping layer 33 may include silicon nitride (SiN) based material or silicon oxide ($SiO_2$) based material. In another embodiment, the dummy gate capping layer 33 may be omitted. The gate spacers 34 may include a material having an etch selectivity with respect to the dummy gate electrode 32. For example, the gate spacers 34 may include a silicon nitride (SiN) based material.

Figure 6A:
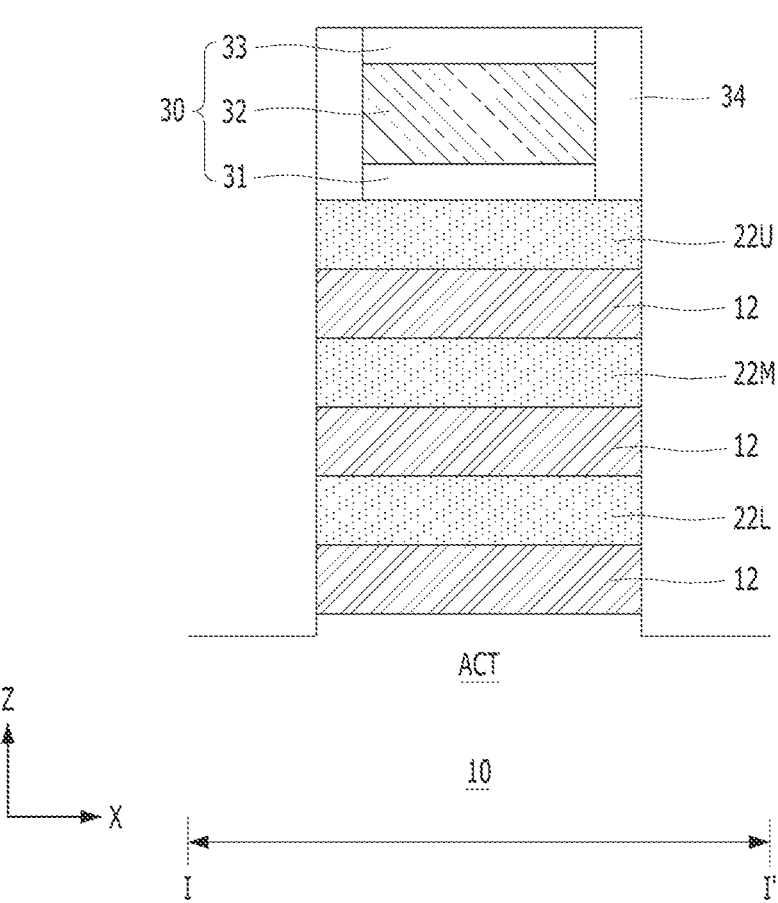
Figure 6B:
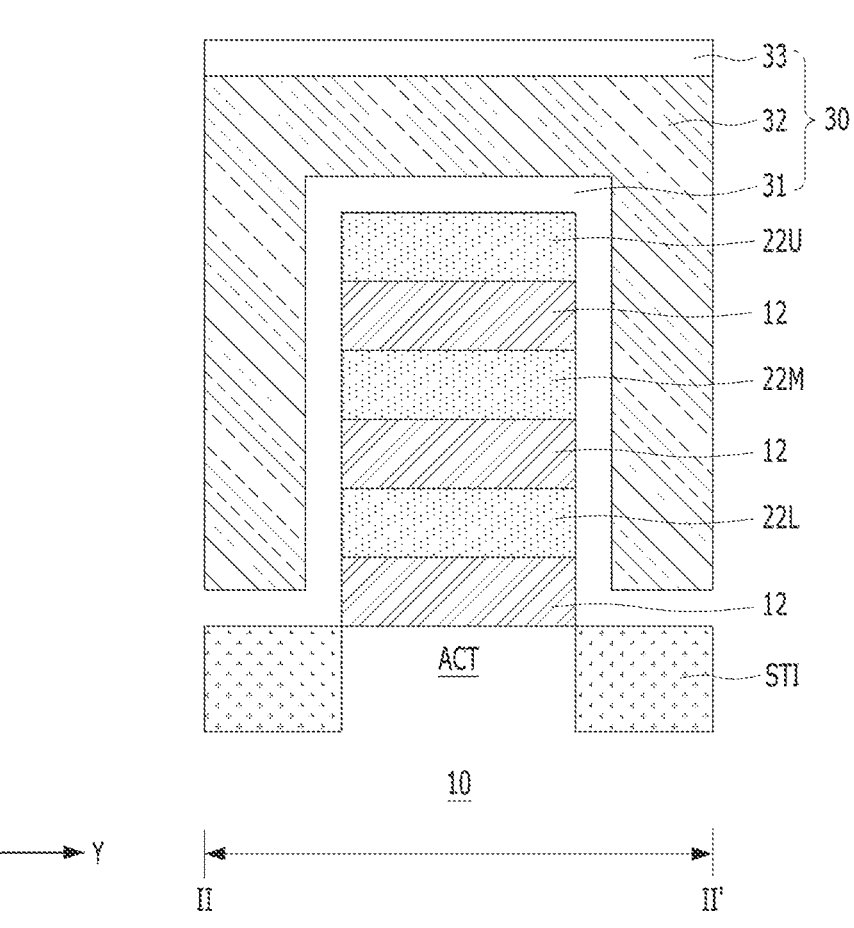

Referring to FIGS. 6A and 6B, the method may further include patterning the sacrificial layers 11 and the channel layers 21L, 21M, and 21U by performing an etching process using the dummy gate structure 30 and the gate spacers 34 as an etch mask. The sacrificial layers 11 may be patterned to be formed into sacrificial patterns 12, and the channel layers 21L, 21M, and 21U may be patterned to be formed into channel patterns 22L, 22M, and 22U.

Figure 7A:
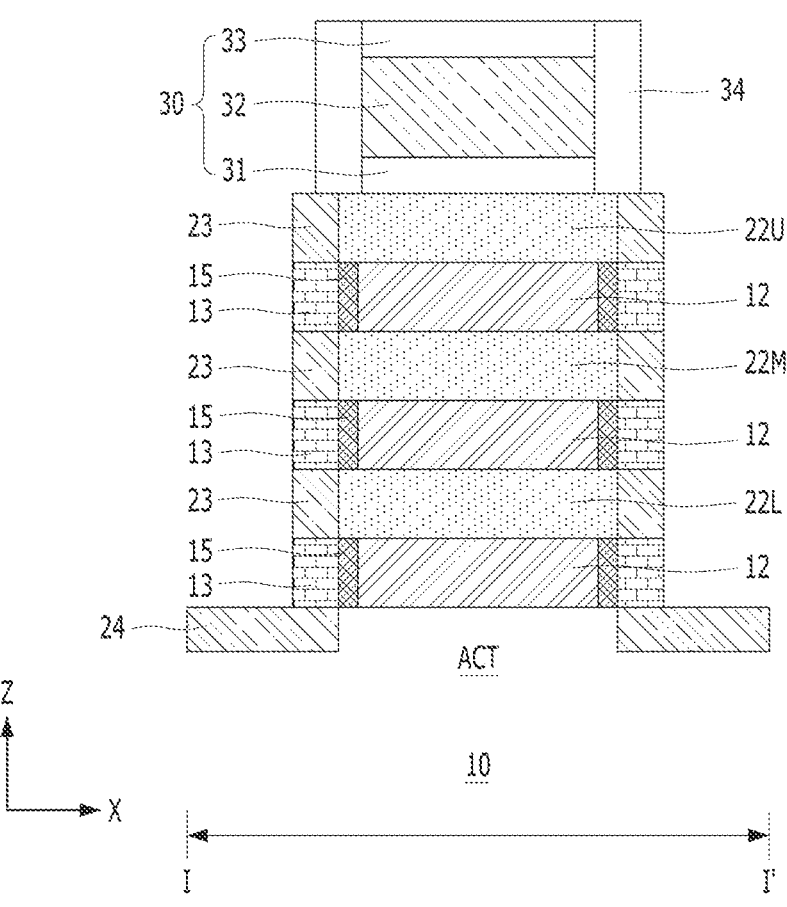
Figure 7B:
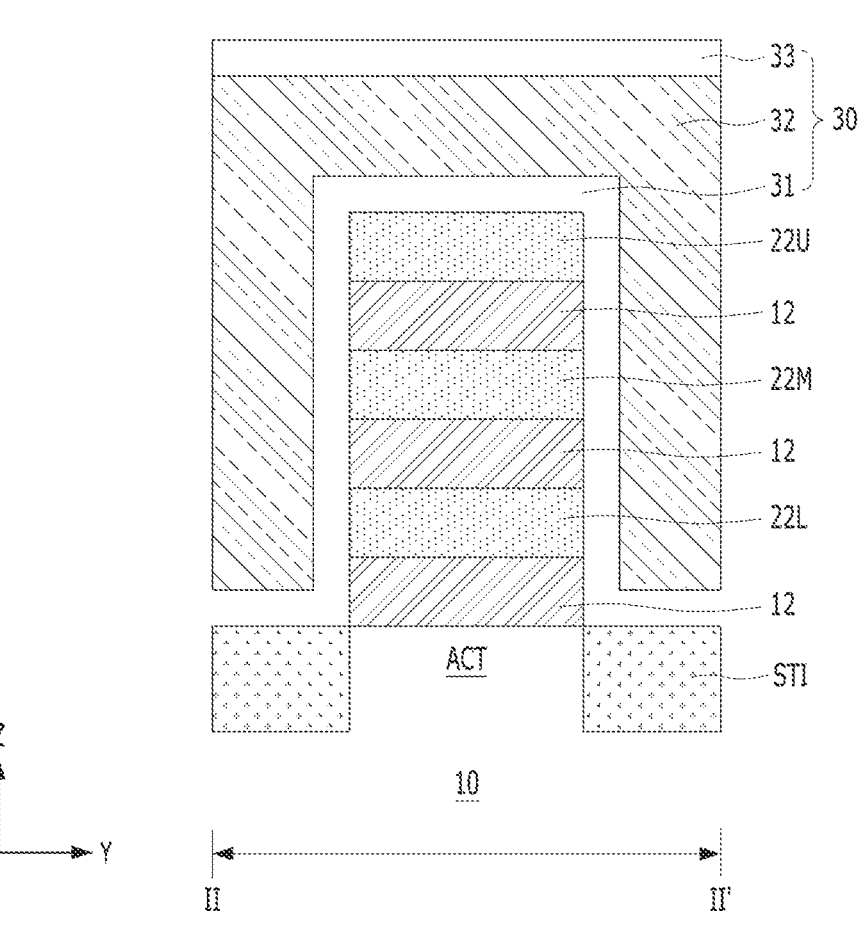

Referring to FIGS. 7A and 7B, the method may further include forming outer side spacer patterns 15, sacrificial oxide patterns 13, and channel oxide patterns 23 by performing an oxidation process. In this process, a portion of the surface of the substrate 10 may be oxidized to further form substrate oxide patterns 24. The outer side spacer patterns 15 and the sacrificial oxide patterns 13 may be formed on side end portions of the sacrificial patterns 12. For example, the side end portions of the sacrificial patterns 12 may be reformed into the outer side spacer patterns 15 and the sacrificial oxide patterns 13. The sacrificial oxide patterns 13 may be formed on outer surfaces of the outer side spacer patterns 15. In an embodiment, each of the outer side spacer patterns 15 may include a high concentration germanium (Ge) layer. In an embodiment, each of the outer side spacer patterns 15 may include a Si-poor or Ge-rich silicon germanium (SiGe) region. For example, the oxidation process may be performed at a temperature of about 800° C. or higher. In the oxidation process, end portions of the channel patterns 22L, 22M, and 22U may be oxidized. In the oxidation process, silicon atoms in the sacrificial patterns 12 may move to the oxidized regions of the channel patterns 22L, 22M, and 22U. That is, the channel patterns 22L, 22M, and 22U may absorb silicon (Si) atoms in the sacrificial patterns 12 while being oxidized. Accordingly, silicon (Si) cavitated regions may occur in the sacrificial patterns 12 by a silicon (Si) cavitation phenomenon. The silicon (Si) cavitated regions may include high-concentration germanium (Ge). Accordingly, some of end portions of the sacrificial patterns 12 may be reformed into Si-poor or Ge-rich silicon germanium (SiGe) regions. Some of the end portions of the sacrificial patterns 12 may be oxidized and reformed into sacrificial oxide patterns 13. The sacrificial oxide patterns 13 may include germanium oxide (GeO) or silicon-poor or germanium-rich silicon germanium oxide (SiGeO).

Figure 8A:
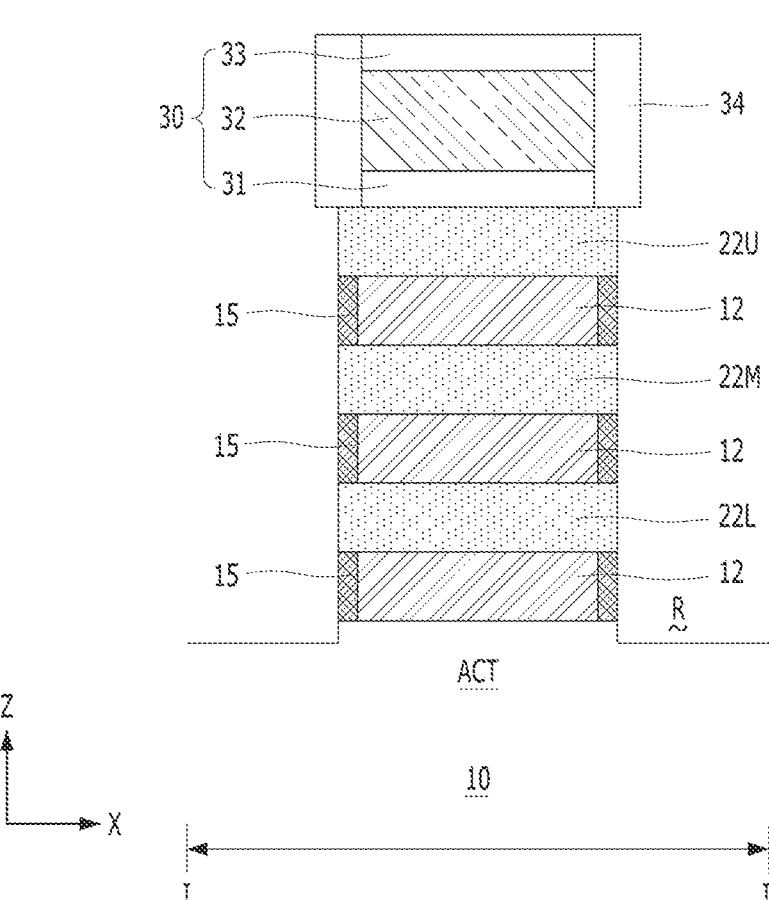
Figure 8B:
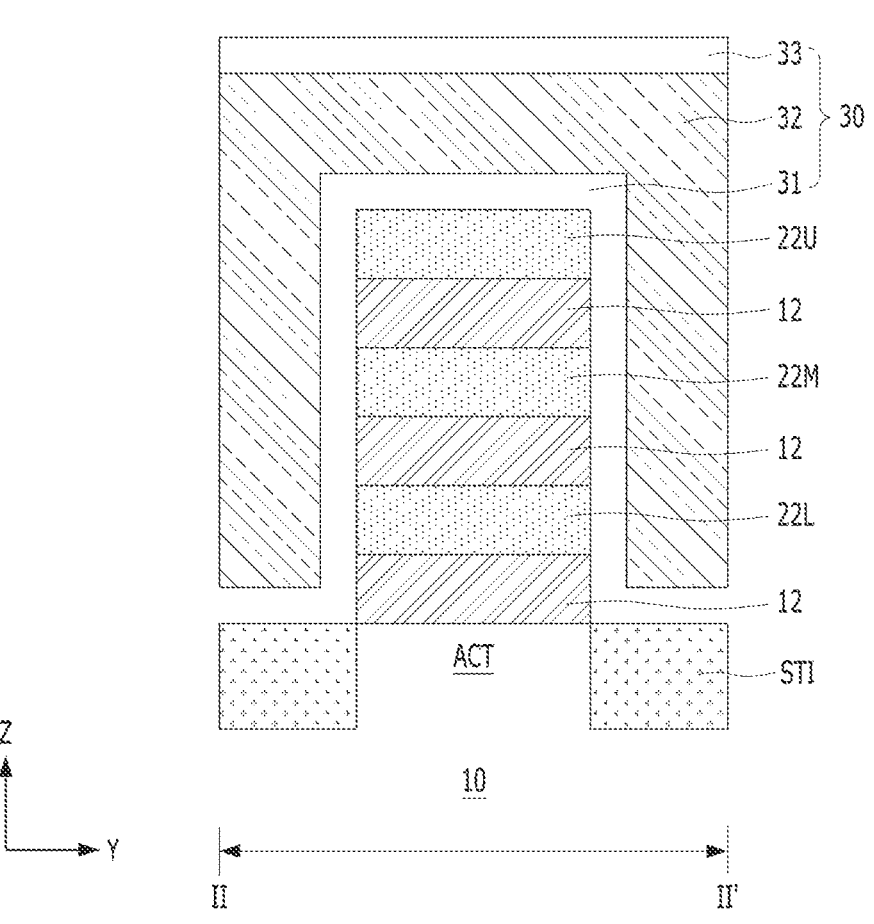

Referring to FIGS. 8A and 8B, the method may further include removing the sacrificial oxide patterns 13 and the channel oxide patterns 23 by performing an oxide removal process. The substrate oxide pattern 24 may also be removed. The oxide removal process may include performing a wet etching process or a wet cleaning process using a chemical containing hydrofluoric acid (HF). The outer side spacer patterns 15 may remain.

Figure 9A:
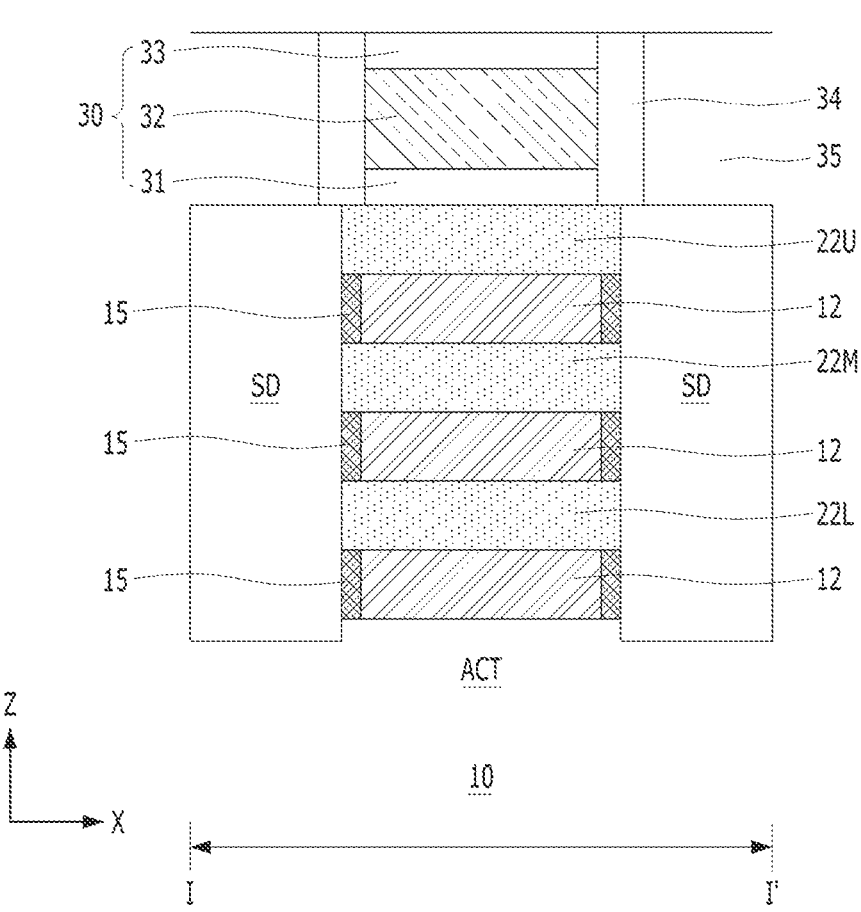
Figure 9B:
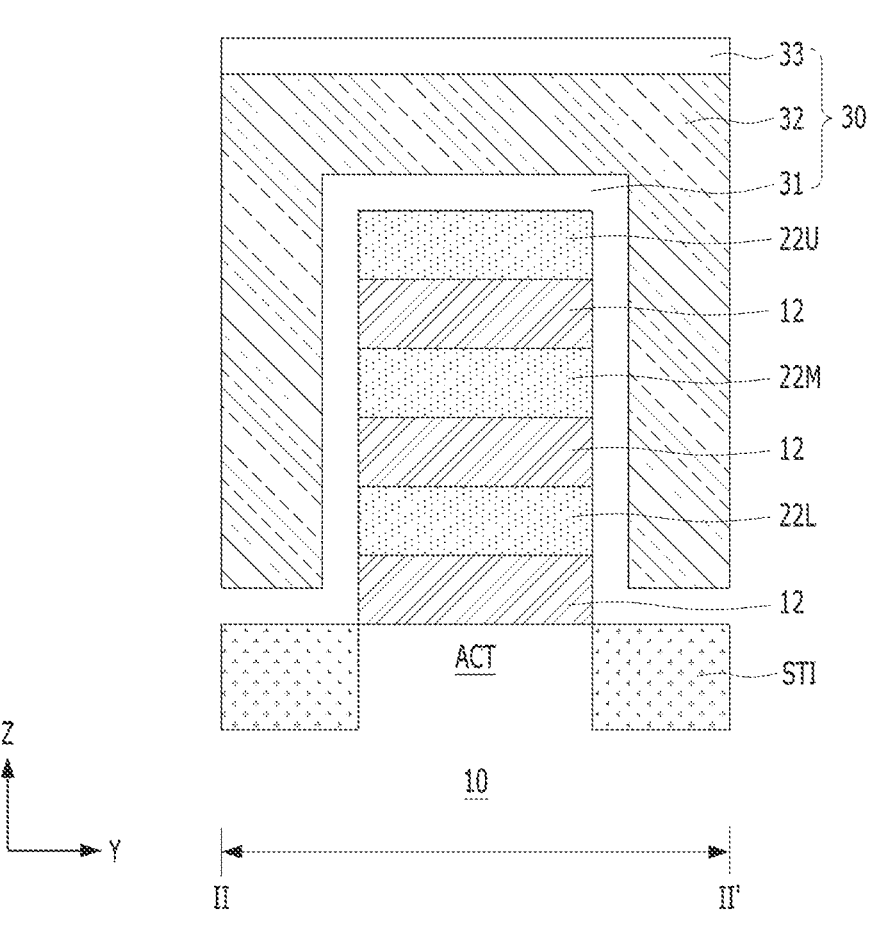

Referring to FIGS. 9A and 9B, the method may further include forming source/drain regions SD and an interlayer insulating layer 35. Forming the source/drain regions SD may include performing an epitaxial growth process. The source/drain regions SD may include one of silicon containing phosphorous (Si:P) or silicon germanium containing boron (SiGe:B). Forming the interlayer insulating layer 35 may include forming at least one of the following: silicon oxide ($SiO_2$), silicon carbon oxide (SiCO), silicon hydrogen oxide (SiHO), silicon carbon hydrogen oxide (SiCHO), or silicon oxide ($SiO_2$) containing various impurities. The method may further include performing a chemical mechanical polishing (CMP) process to co-planarize top surfaces of the dummy gate capping layer 33 and the interlayer insulating layer 35.

Figure 10A:
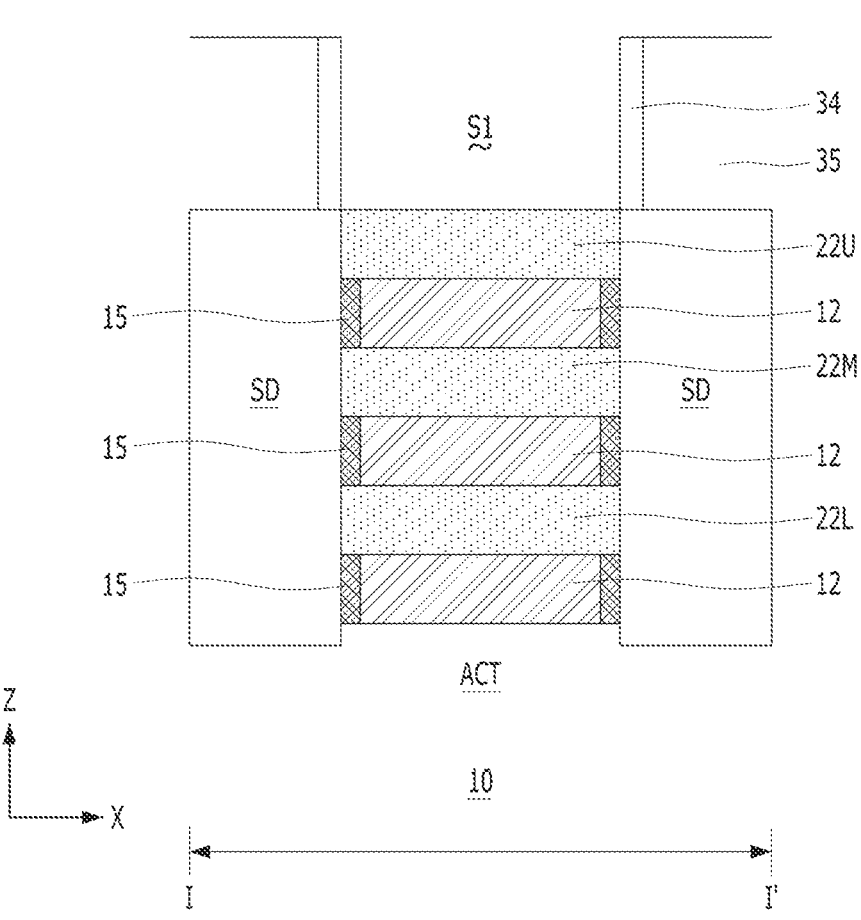
Figure 10B:
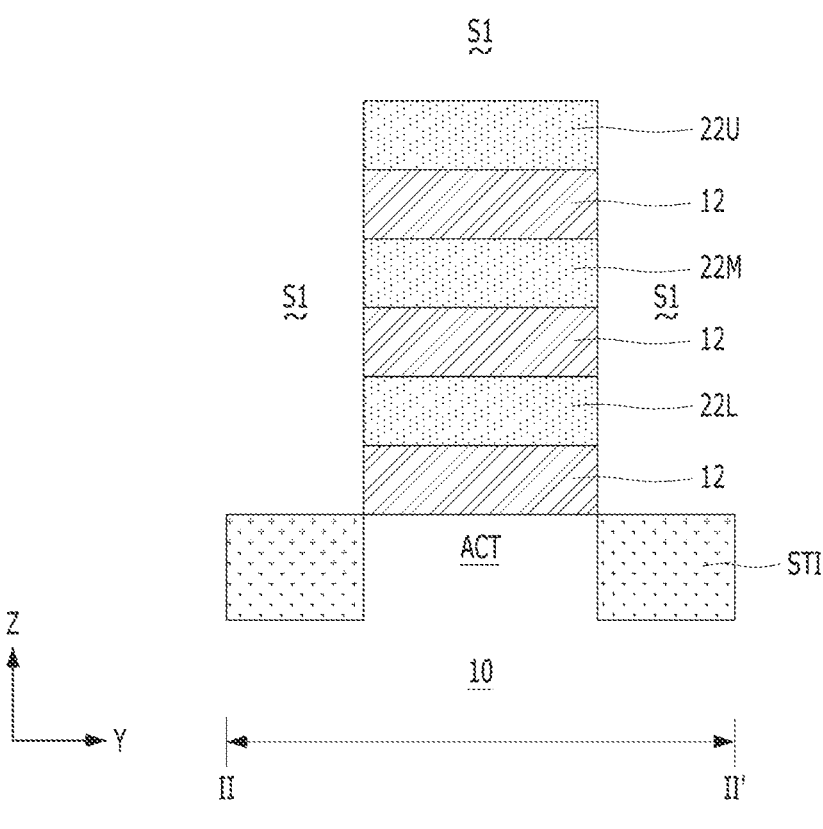

Referring to FIGS. 10A and 10B, the method may further include removing the dummy gate structure 30 to form a first gate space S1 between the gate spacers 34. For example, a top surface of the upper channel pattern 22U may be exposed in the first gate space S1 in a longitudinal cross-sectional view in the first horizontal direction X, and the top and side surfaces of the upper channel pattern 22U and side surfaces of the sacrificial patterns 12 and channel patterns 22L and 22M may be exposed in the first gate space S1 in the longitudinal cross-sectional view in the second horizontal direction Y.

Figure 11A:
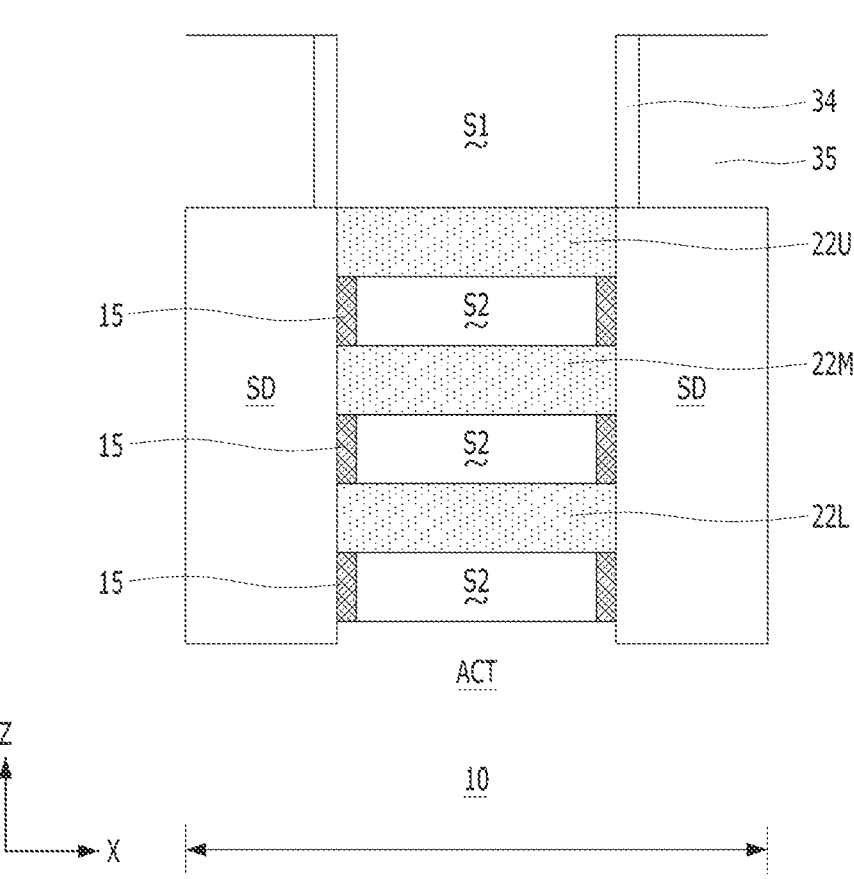
Figure 11B:
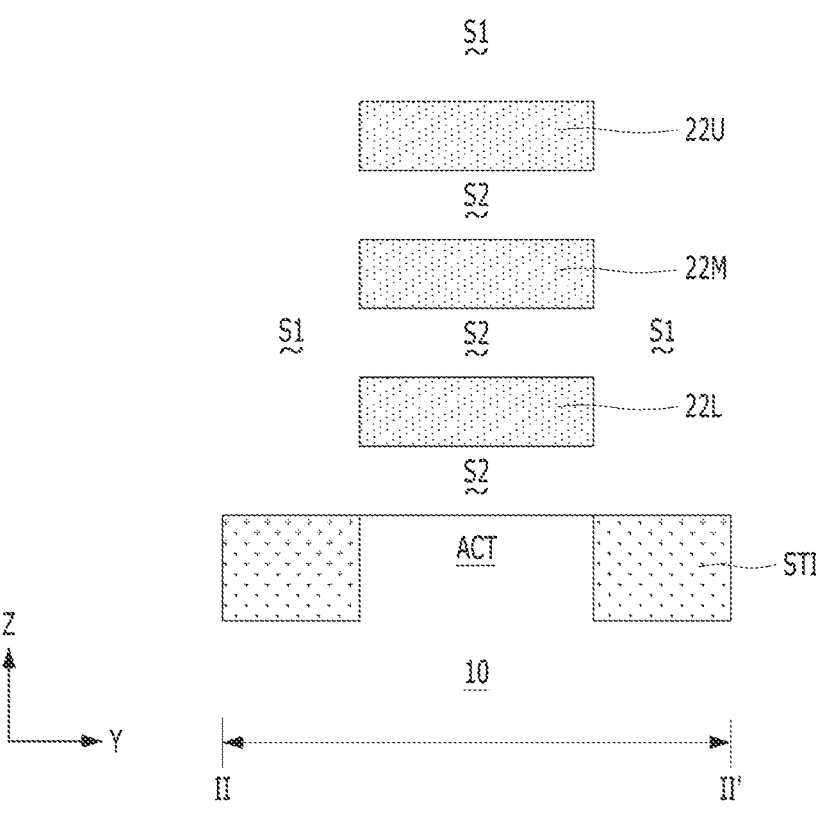

Referring to FIGS. 11A and 11B, the method may further include removing the sacrificial patterns 12 to form second gate spaces S2 between the channel patterns 22L, 22M, and 22U. The surface of the active region ACT may also be exposed in a lowermost second gate spaces S2.

Figure 12A:
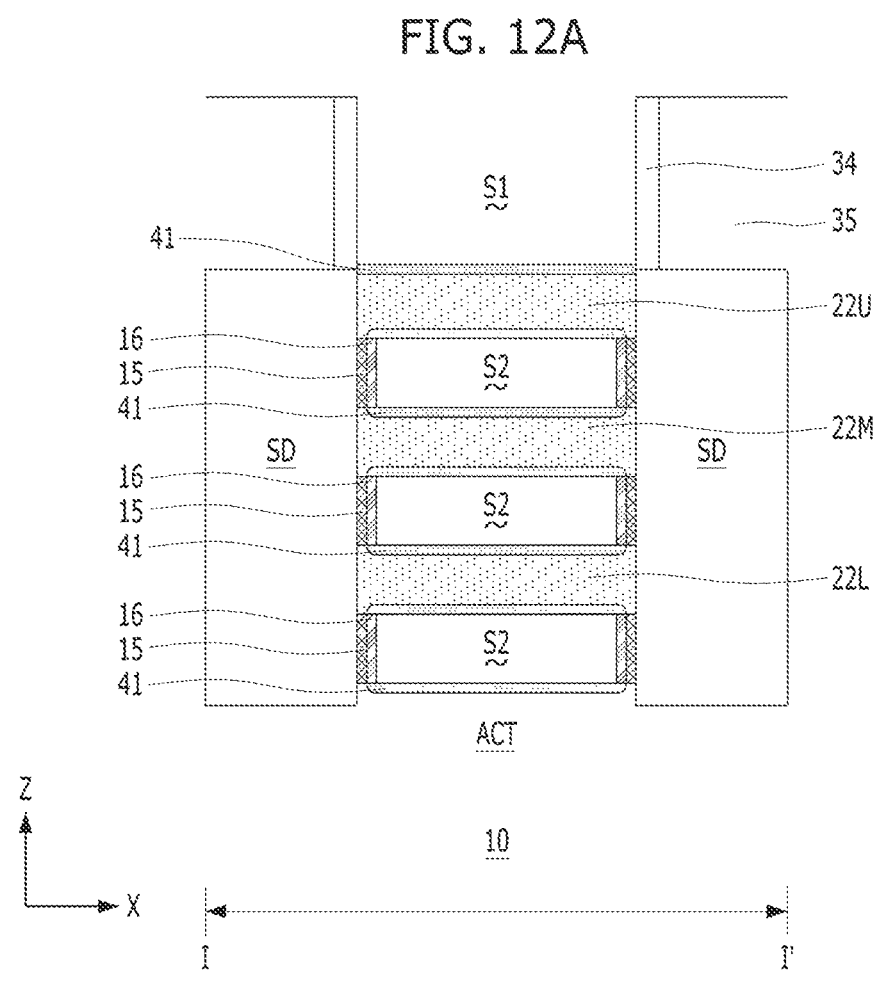
Figure 12B:
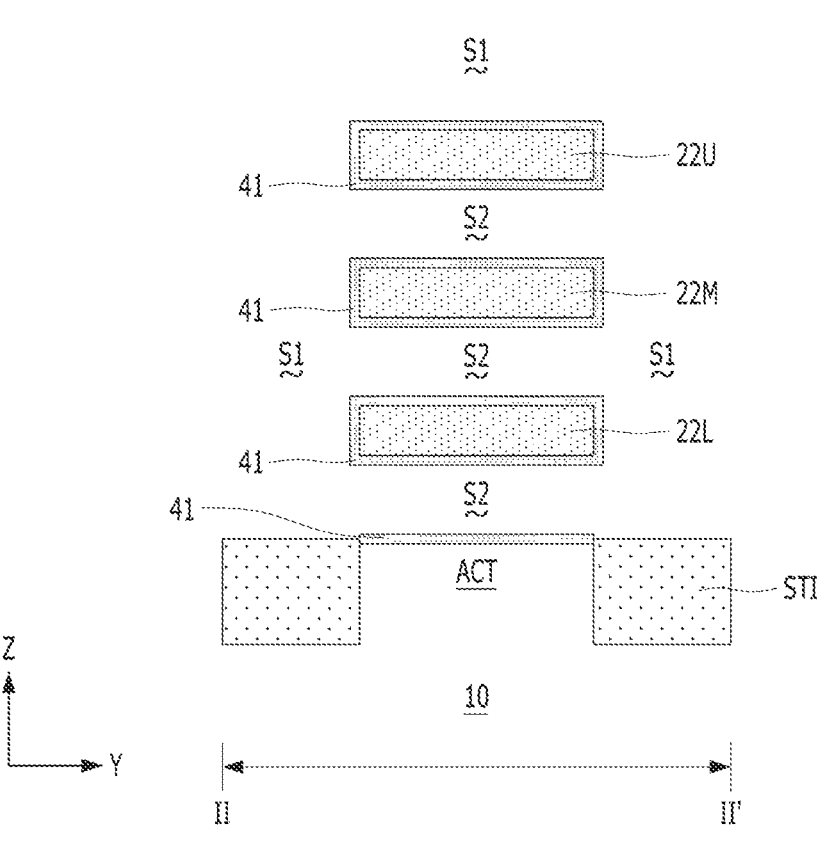

Referring to FIGS. 12A and 12B, the method may further include performing an oxidation process to form interfacial insulating layers 41 and inner side spacer patterns 16 over the surfaces of the channel patterns 22L, 22M, and 22U and on the outer side spacer patterns 15. In the longitudinal cross-sectional view in the first horizontal direction X, the interfacial insulating layers 41 may be formed over the upper and lower surfaces of the channel patterns 22L, 22M, and 22U exposed in the first gate space S1 and the second gate spaces S2. In the longitudinal cross-sectional view in the second horizontal direction Y, the interfacial insulating layers 41 may surround the surfaces of the channel patterns 22L, 22M, and 22U exposed in the first gate space S1 and the second gate spaces S2. The interfacial insulating layers 41 may include oxidized silicon ($SiO_2$). For example, the interfacial insulating layers 41 may be formed by oxidizing a portion of the channel patterns 22L, 22M, and 22U. In the longitudinal cross-sectional view in the first horizontal direction X, the inner side spacer patterns 16 may be formed on the side surfaces of the outer side spacer patterns 15 exposed in the second gate spaces S2. For example, the inner side spacer patterns 16 may be formed by oxidizing a portion of the outer side spacer patterns 15.

Figure 13A:
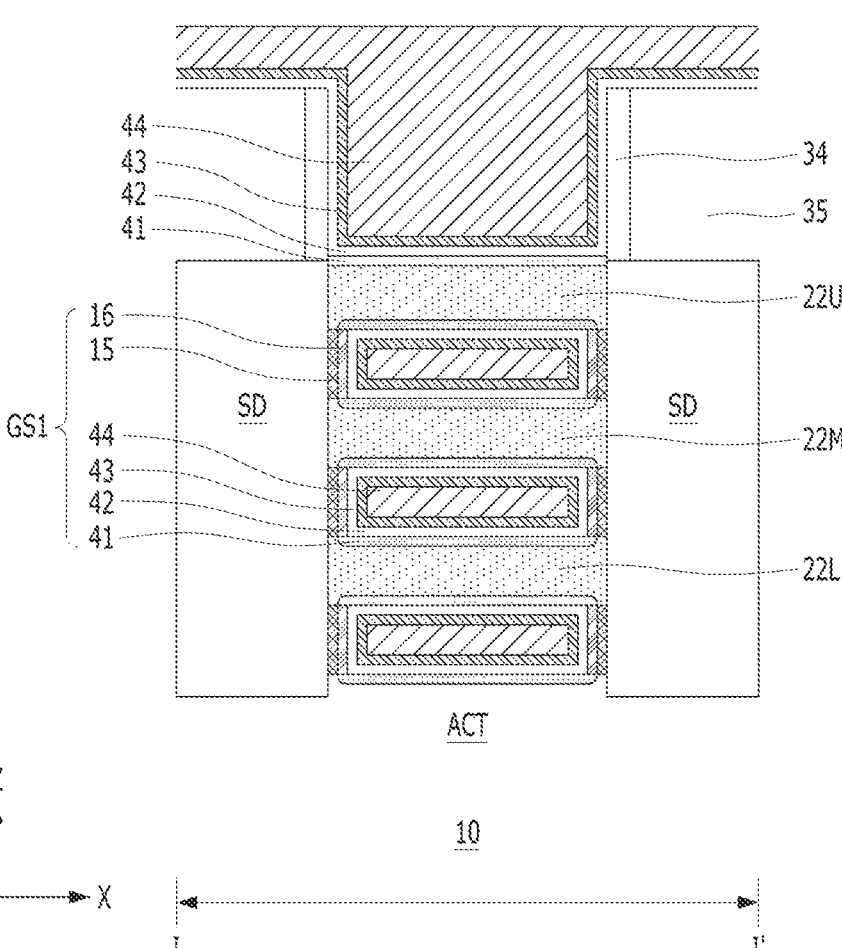
Figure 13B:
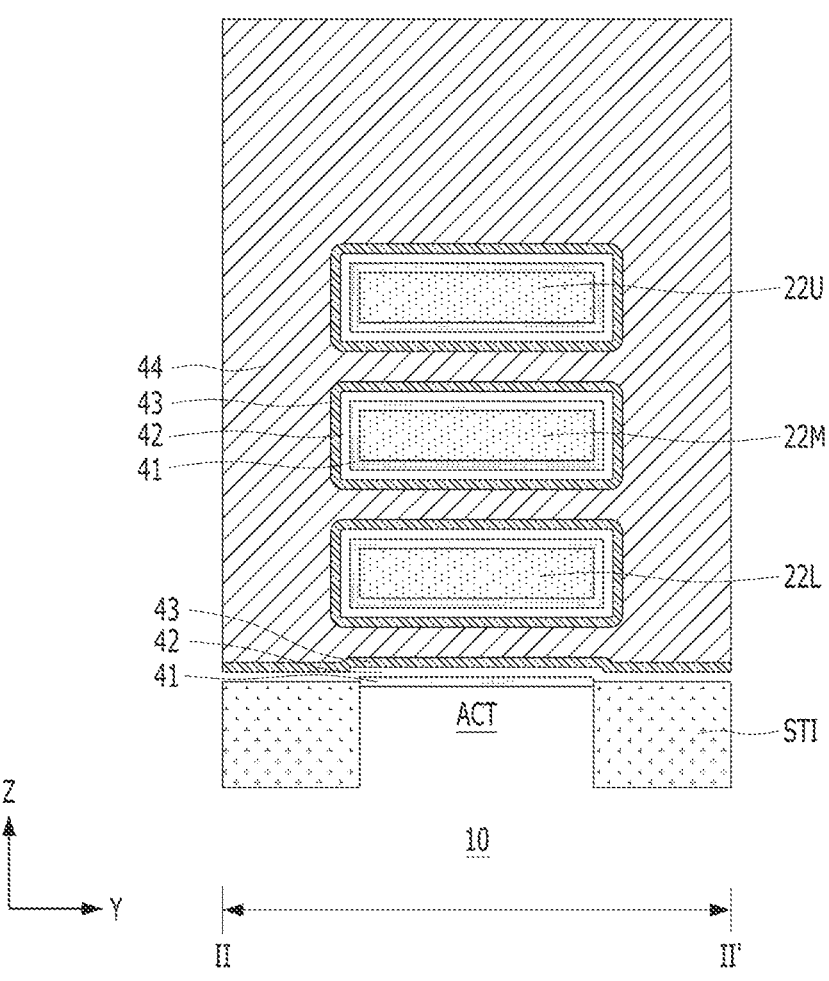

Referring to FIGS. 13A and 13B, the method may further include performing deposition processes to form gate insulating layers 42, gate barrier layers 43, and gate electrodes 44 in the first gate space S1 and the second gate spaces S2. Forming the gate insulating layers 42 may include conformally forming a high-k dielectric insulating layer such as hafnium oxide (HfO) over the interfacial insulating layers 41 and the inner side spacer patterns 16 by performing a deposition process. In the longitudinal cross-sectional view in the first horizontal direction X, the gate insulating layers 42 may be conformally formed on inner surfaces of the interfacial insulating layers 41 and the inner side spacer patterns 16. That is, in the longitudinal cross-sectional view in the first horizontal direction X, the gate insulating layers 42 may be surrounded by the interfacial insulating layers 41 and the inner side spacer patterns 16. In the longitudinal cross-sectional view in the second horizontal direction Y, the gate insulating layers 42 may conformally surround the surface of the interfacial insulating layers 41.

Forming the gate barrier layers 43 may include conformally forming barrier metal layers such as titanium nitride (TiN) over the gate insulating layers 42 by performing a deposition process. In the longitudinal cross-sectional view in the first horizontal direction X, the gate barrier layers 43 may be surrounded by the gate insulating layers 42. In the longitudinal cross-sectional view in the second horizontal direction Y, the gate barrier layers 43 may conformally surround surfaces of the gate insulating layers 42. Forming the gate electrodes 44 may include forming at least one of metal, metal alloy, or metal compound to completely fill the first and second gate spaces S1 and S2 over the gate barrier layers 43 by performing a deposition process. In the longitudinal cross-sectional view in the first horizontal direction X, the gate electrodes 44 may be surrounded by the gate barrier layer 43. In the longitudinal cross-sectional view in the second horizontal direction Y, the gate electrodes 44 may surround the gate barrier layers 43. Thereafter, referring to FIGS. 2A to 2C, the method may further include performing a planarization process such as CMP and performing a deposition process to form a capping insulating layer 36. The capping insulating layer 36 may include an insulating material, such as silicon nitride, having an etch selectivity with respect to the interlayer insulating layer 35.

Figure 14A:
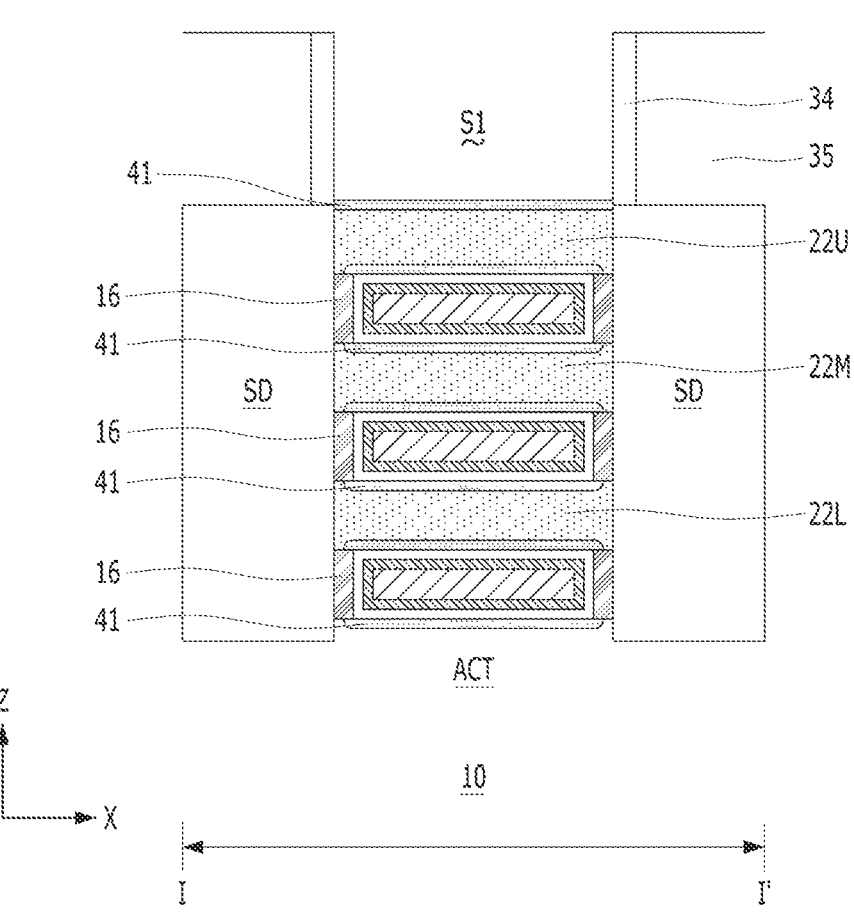
FIGS. 14A and 14B are views illustrating a method of manufacturing a semiconductor device according to various embodiments of the present disclosure.
Figure 14B:
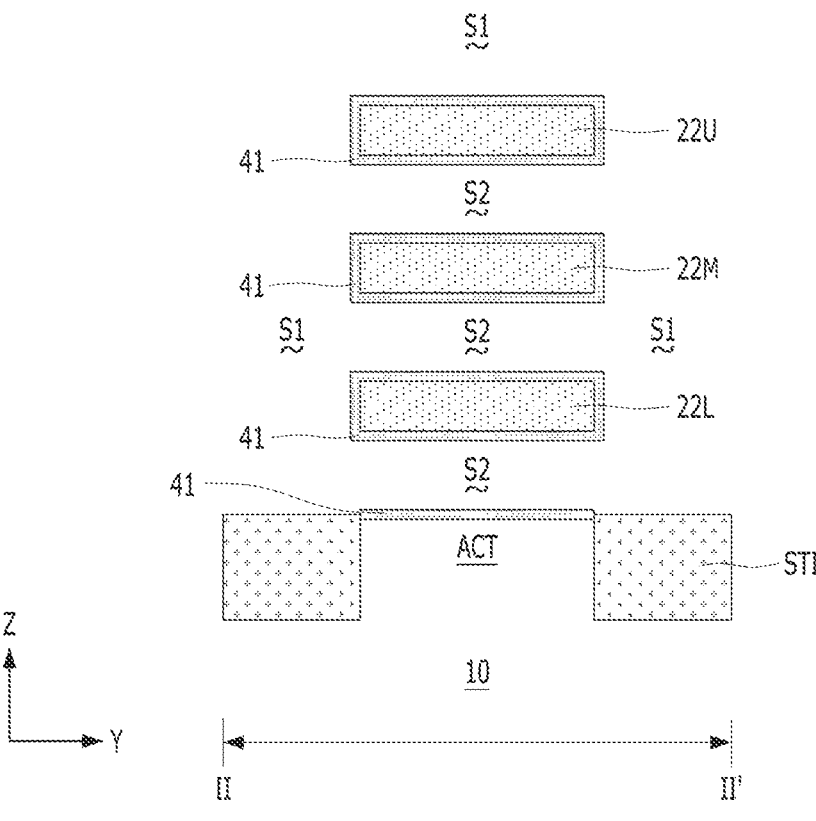

FIGS. 14A and 14B are views illustrating a method of manufacturing a semiconductor device according to an embodiment of the present disclosure. Referring to FIGS.

14A and 14B, a method of manufacturing a semiconductor device according to an embodiment of the present disclosure may include performing the processes described with reference to FIGS. 4A and 4B to FIGS. 11A and 11B, and further performing the oxidation process described with reference to FIGS. 12A and 12B to form interfacial insulating layers 41 and internal side spacer patterns 16. The outer side spacer patterns 15 may be fully reformed into the inner side spacer patterns 16. Thereafter, the method may further include performing the processes described with reference to FIGS. 13A and 13B, and to FIGS. 14A and 14B, performing the planarization process such as a CMP process described with reference to FIGS. 3A to 3B, and further performing the deposition process to form a capping insulating layer 36.

According to the embodiments of the present disclosure, the side spacer patterns including germanium (Ge) can provide lattice stress to source/drain regions and channel patterns of a transistor. Carrier mobility of the source/drain regions and the channel patterns can be improved.

According to the embodiments of the present disclosure, parasitic capacitance between the gate electrodes and the source/drain regions can be reduced.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A semiconductor device comprising:
source/drain regions formed over a substrate; and
channel patterns and gate structures formed between the source/drain regions in a horizontal direction,
wherein the channel patterns are arranged to be spaced apart from each other over a surface of the substrate in a vertical direction,
wherein the gate structures are disposed between the channel patterns in the vertical direction, and
wherein the gate structures include:
side spacer patterns formed adjacent to the source/drain regions in a first horizontal direction;
interfacial insulating layers formed over upper and lower surfaces of the channel patterns;
gate insulating layers formed over surfaces of the side spacer patterns and over surfaces of the interfacial insulating layers; and
gate electrodes over the gate insulating layers,
wherein the interfacial insulating layers include at least one of oxidized silicon or silicon oxide, and wherein the gate insulating layers include a high-k insulating material,
wherein the side spacer patterns include germanium (Ge),
wherein the gate insulating layers are in contact with the interfacial insulating layers in the vertical direction, and
wherein side end portions of the gate insulating layers are in contact with side surfaces of the side spacer patterns in the vertical direction.

2. The semiconductor device of claim 1,
wherein the side spacer patterns include germanium-rich silicon germanium (SiGe).

3. The semiconductor device of claim 1,
wherein the side spacer patterns include germanium-rich silicon germanium oxide (SiGeO).

4. The semiconductor device of claim 1,
wherein each of the side spacer patterns includes:

a first side spacer pattern disposed adjacent to each of the source/drain regions; and
a second side spacer pattern disposed adjacent to the first side spacer pattern.

5. The semiconductor device of claim 4,
wherein upper and lower end portions of the first side spacer pattern of each of the side spacer patterns are in contact with the channel patterns.

6. The semiconductor device of claim 4,
wherein the first side spacer pattern of each of the side spacer patterns includes germanium (Ge).

7. The semiconductor device of claim 4,
wherein the first side spacer pattern of each of the side spacer patterns has semiconductor characteristics.

8. The semiconductor device of claim 4,
wherein the second side spacer pattern of each of the side spacer patterns includes germanium oxide (GeO).

9. The semiconductor device of claim 1,
wherein side end portions of the interfacial insulating layers are in contact with at least one of upper end portions and lower end portions of the side spacer patterns in the first horizontal direction.

10. A semiconductor device comprising:
source/drain regions formed over a substrate; and
channel patterns and gate structures formed between the source/drain regions in a horizontal direction,
wherein the channel patterns are arranged to be spaced apart from each other over a surface of the substrate,
wherein the gate structures are disposed between the channel patterns in the vertical direction,
wherein the gate structures include:
gate electrodes;
gate insulating layers surrounding the gate electrodes;
interfacial insulating layers surrounding the gate insulating layers; and
first side spacer patterns and second side spacer patterns between the gate insulating layers and the source/drain regions,
wherein inner surfaces of the second side spacer patterns are in contact with the gate insulating layers,
wherein:
the channel patterns include silicon (Si),
the first side spacer patterns include germanium (Ge), and
the second side spacer patterns include germanium oxide (GeO).

11. The semiconductor device of claim 10,
wherein the first side spacer patterns include at least one of pure germanium (Ge) and germanium-rich silicon germanium (SiGe).

12. The semiconductor device of claim 10,
wherein the second side spacer patterns include germanium-rich silicon germanium oxide (SiGeO).

13. The semiconductor device of claim 10,
wherein side surfaces of the first side spacer patterns are in contact with the source/drain regions.

14. The semiconductor device of claim 10,
wherein upper and lower end portions of the first side spacer patterns are in contact with the channel patterns.

15. The semiconductor device of claim 10,
wherein upper and lower end portions of the second side spacer patterns are in contact with the interfacial insulating layers.

16. A semiconductor device comprising:
source/drain regions formed over a substrate; and
channel patterns and gate structures formed between the source/drain regions in a horizontal direction, wherein the channel patterns are arranged to be spaced apart from each other over a surface of the substrate in a vertical direction, wherein the gate structures are disposed between the channel patterns in the vertical direction, and wherein the gate structures include:

side spacer patterns formed adjacent to the source/drain regions in a first horizontal direction;

interfacial insulating layers formed over upper and lower surfaces of the channel patterns;

gate insulating layers formed over surfaces of the side spacer patterns and over surfaces of the interfacial insulating layers; and gate electrodes over the gate insulating layers, wherein:

the interfacial insulating layers includes a first material, the gate insulating layers includes a second material different from the first material.

17. The semiconductor device of claim 16, wherein:

the first material includes silicon, and the second material includes metal.

18. The semiconductor device of claim 16, wherein inner surfaces of the side spacer patterns are in contact with the gate insulating layers.

19. The semiconductor device of claim 16, wherein upper and lower end portions of the side spacer patterns are in contact with the interfacial insulating layers.

\* \* \* \* \*